United States Patent [19]

Iwashima

[11] Patent Number: 4,667,314
[45] Date of Patent: May 19, 1987

[54] COMPACT DISC PLAYER FOR PLAYING A SEQUENCE OF DISCS AND SELECTING A SEQUENCE OF STORED PROGRAMS IN EACH DISC TO BE PLAYED

[75] Inventor: Toshiro Iwashima, Kanagawa, Japan

[73] Assignee: U.S. Philips Corporation, New York, N.Y.

[21] Appl. No.: 779,191

[22] Filed: Sep. 23, 1985

[30] Foreign Application Priority Data

Sep. 28, 1984 [JP] Japan ................................ 59-204370

[51] Int. Cl.$^4$ ........................ G11B 17/22; G11B 27/19
[52] U.S. Cl. ........................................ 369/32; 369/34; 369/41; 360/69
[58] Field of Search ........................ 360/72.1, 69, 75; 369/32, 33, 34–39, 41; 364/410, 411

[56] References Cited

U.S. PATENT DOCUMENTS

| | | | |
|---|---|---|---|
| 3,938,190 | 2/1976 | Semmlow et al. | 360/69 |
| 4,093,832 | 6/1978 | Isaacson | 369/33 |
| 4,180,802 | 12/1979 | Oosterhouse | 369/34 |
| 4,180,838 | 12/1979 | Fehrenkamp | 360/72.1 |
| 4,258,838 | 3/1981 | Rockola et al. | 369/34 |
| 4,538,253 | 8/1985 | Ishibashi et al. | 369/34 |

Primary Examiner—Raymond F. Cardillo
Assistant Examiner—Steven R. Garland
Attorney, Agent, or Firm—Thomas A. Briody; William J. Streeter; Marianne R. Rich

[57] ABSTRACT

In a compact disc player with a plurality of compact disc, a random number generator selects the disc to be played and another random number generator selects the part of the disc to be played.

4 Claims, 6 Drawing Figures

COMPACT DISC PLAYER FOR PLAYING A SEQUENCE OF DISCS AND SELECTING A SEQUENCE OF STORED PROGRAMS IN EACH DISC TO BE PLAYED

This invention is concerned with a compact disc player which may be furnished with a plurality of compact discs on which at least one piece of audible information is recorded and with which one of these compact discs may be selected and played on the basis of the operation of a controlling part.

Audio equipment which is intended for providing music all day long and audio equipment used for broadcasting by way of cables music for periods of some one to three hours generally operate using a tape on which many pieces of music have been recorded.

However the compilation of such a tape involves a considerable amount of effort and is very troublesome and expensive. Furthermore the greatest problem with background music is that the listeners inevitably remember what the next tune is going to be and, when this occurs they start to anticipate the next tune and the music is then no longer simply background music.

The applicant has already submitted applications for auto-players in which some 10 to 20 compact discs are provided in a compact disc player and in which any one of these discs can be selected and played automatically (for example Japanese Patent Application number 149660 of 1982). With this type of equipment continuous play is possible for a period of some 10 to 20 hours.

Summary of the Invention

In order to overcome the above problems the invention is characterized in that the player is provided with a random number generator for disc selection and a random number generator for selection of the piece number. The aforementioned control part is automatically controlled by the random number outputs of these random numbers generators. With the invention a random number generator for disc selection and a random number generator for tune number selection are provided in a compact disc auto-player. The disc and the tune number are selected and played automatically and non-specifically by means of the random number outputs from these generators and so the number sequence in which the tunes are reproduced is different every time. The is no need for troublesome editing and the costs are not high. Furthermore the listener cannot remember what the next tune will be and so his enjoyment of the next tune is not spoiled and it is possible to provide good quality background music in this way.

DESCRIPTION OF THE FIGURES

The drawings are of an example of the invention. Thus

DESCRIPTION OF THE PREFERRED EMBODIMENT

Figure 1:
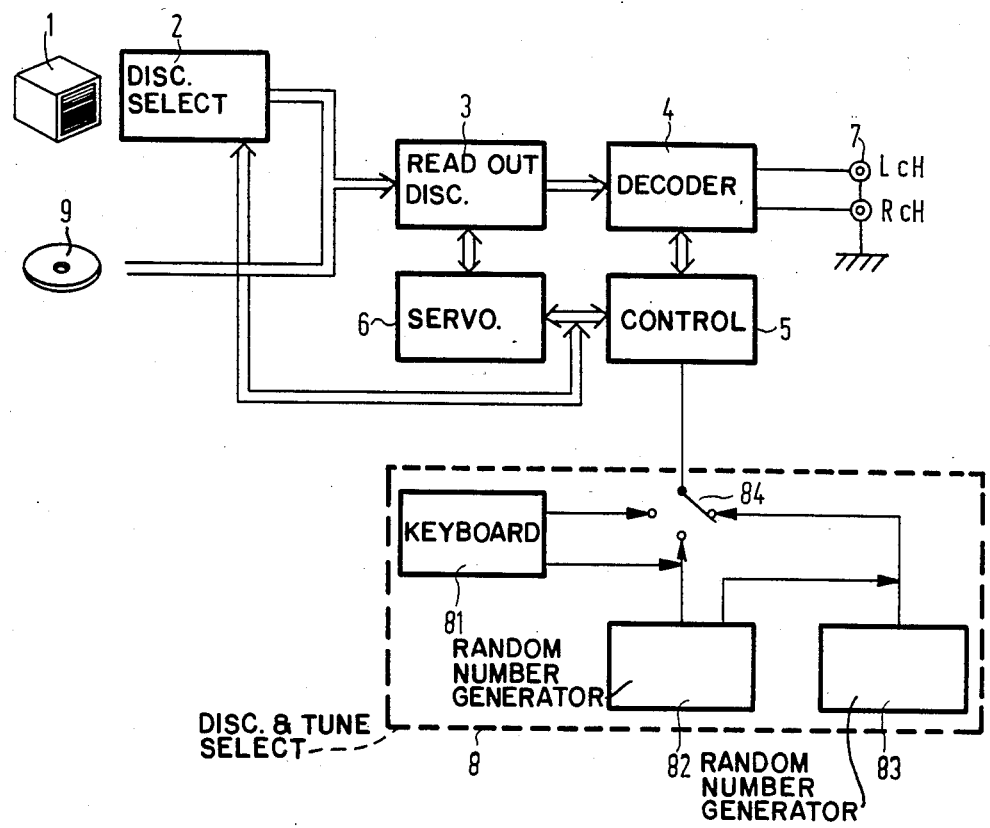
FIG. 1 is a block diagram of the essentials of the construction of this example.

The outline construction of a compact disc player of this invention is shown in FIG. 1. In FIG. 1, 1 is the disc box in which 20 compact discs (referred to below simply as discs) are housed in such a way that they can be removed and replaced freely. 2 is the disc selection equipment which can push out any of the disc from the disc box and set it in a prescribed position. 3 is a pick-up system which reads out the digital words of music information of time information etc. from the disc which has been set. 4 is a decoder which forms the audio signal supplying it to the output terminals 7. 5 and 6 are a control part and a servo system for switching the pick-up system 3 and the decoder 4 and also the disc selection equipment 2 ON and OFF and executes the various operations involved in tune number selection and disc selection.

Furthermore 8 is the disc selection and tune number selection setting part in which 81 is a keyboard for manual input, 82 is a random number generator for disc selection, 83 is a random number generator for tune number seection and 84 is a switching mechanism for switching and connecting these part to the control part 5.

One chip microcomputers are employed for the random number generator for disc selection 82 and the random number generator for tune number selection 83. Furthermore, these can be switched ON or OFF from the keyboard, being constructed with prescribed circuits. The switching and connections with the switching mechanism 84 are as follows:

a: Keyboard 81
b: Random number generator for disc selection 82
c: Random number generator for disc selection and the random number generator for tune number selection.

The random number generator for disc selection 82 and the random number generator for tune number selection 83 respectively generate the digital codes for the discs which are numbered 1–20 and the digital codes for the tune numbers 1–15. These numbers are read out at random with a sutable time difference and stored on the memory of the control part 5.

Figure 2A:
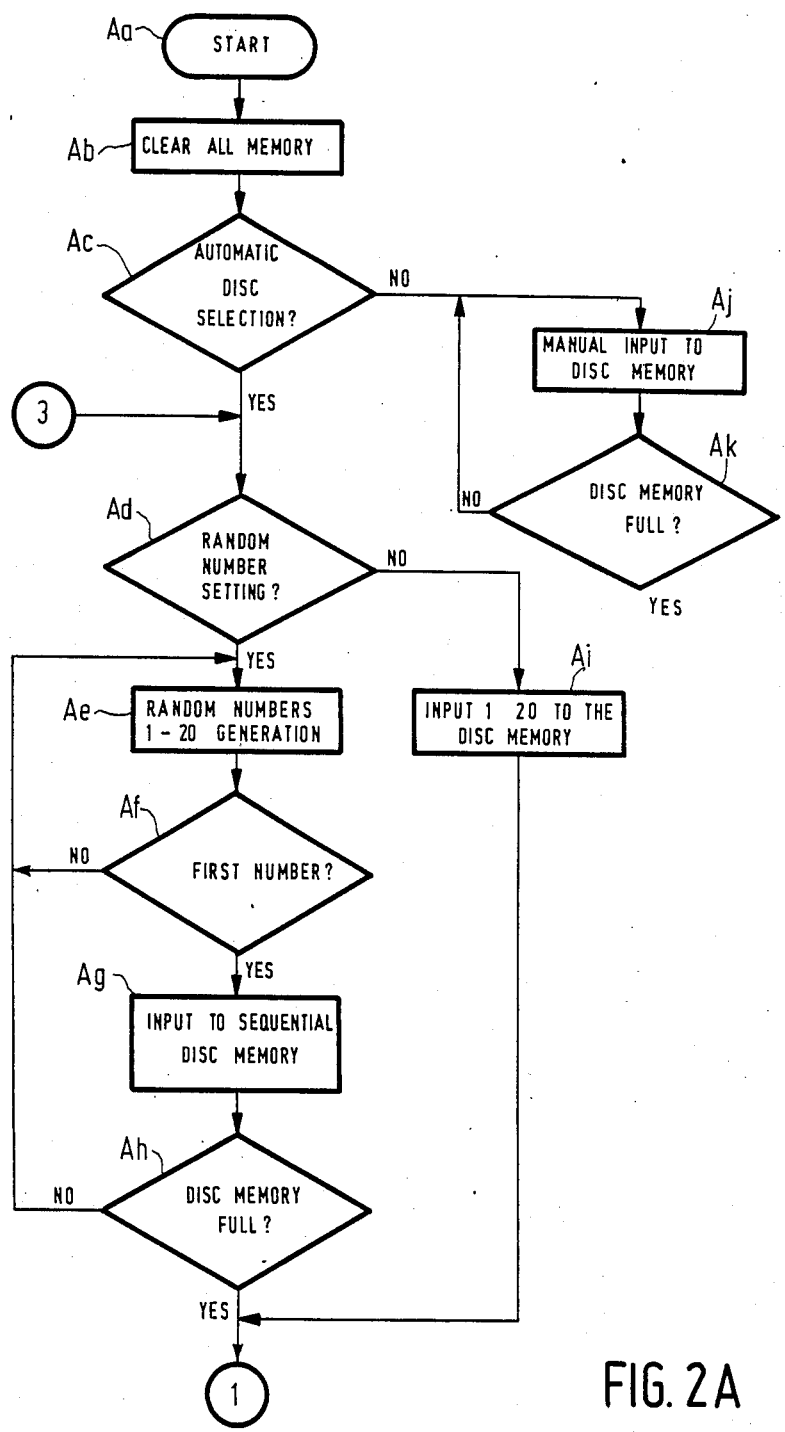
FIGS. 2(A)—2(D) are flow charts and FIG. 3 is an explanatory drawing.
Figure 2B:
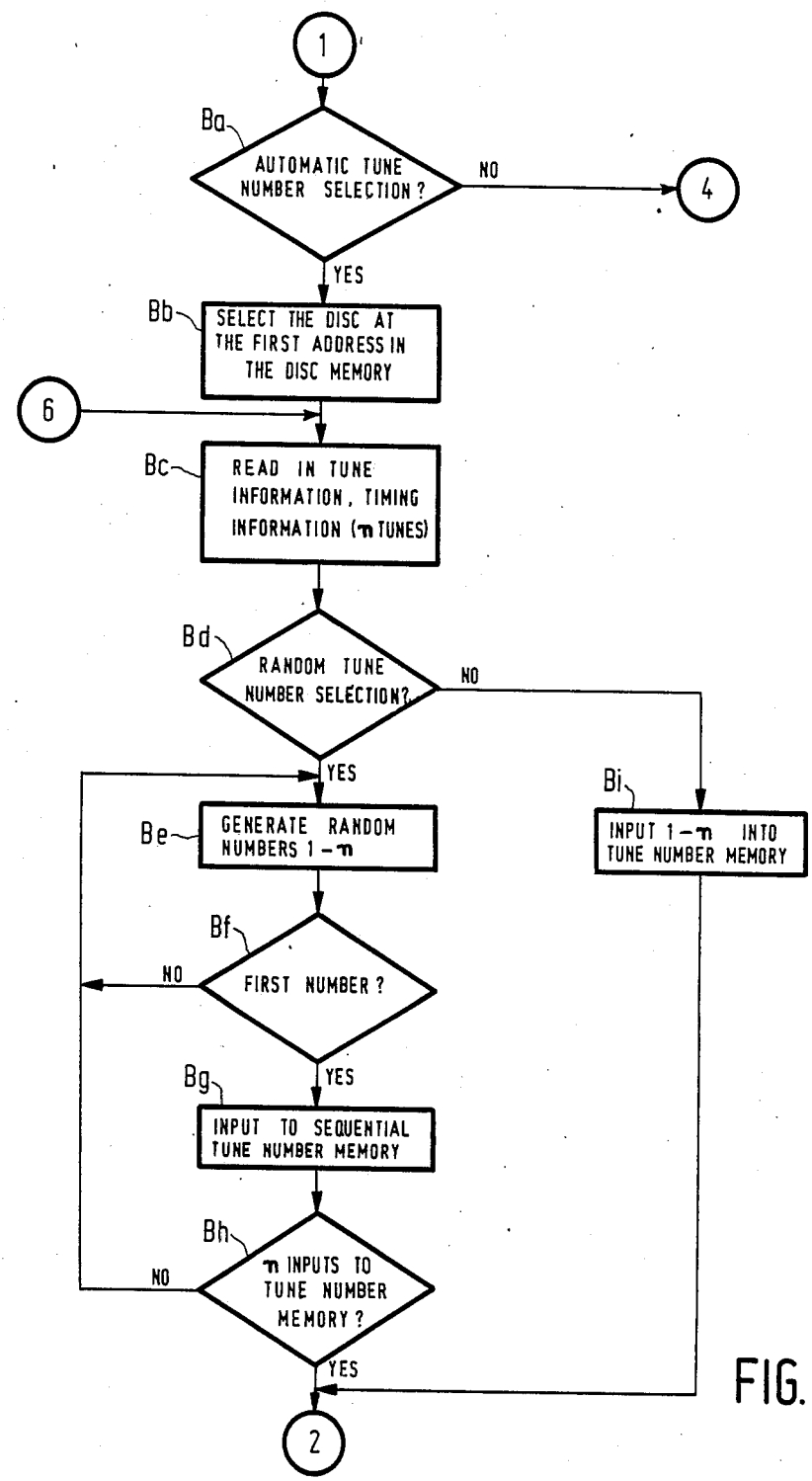
Figure 2C:
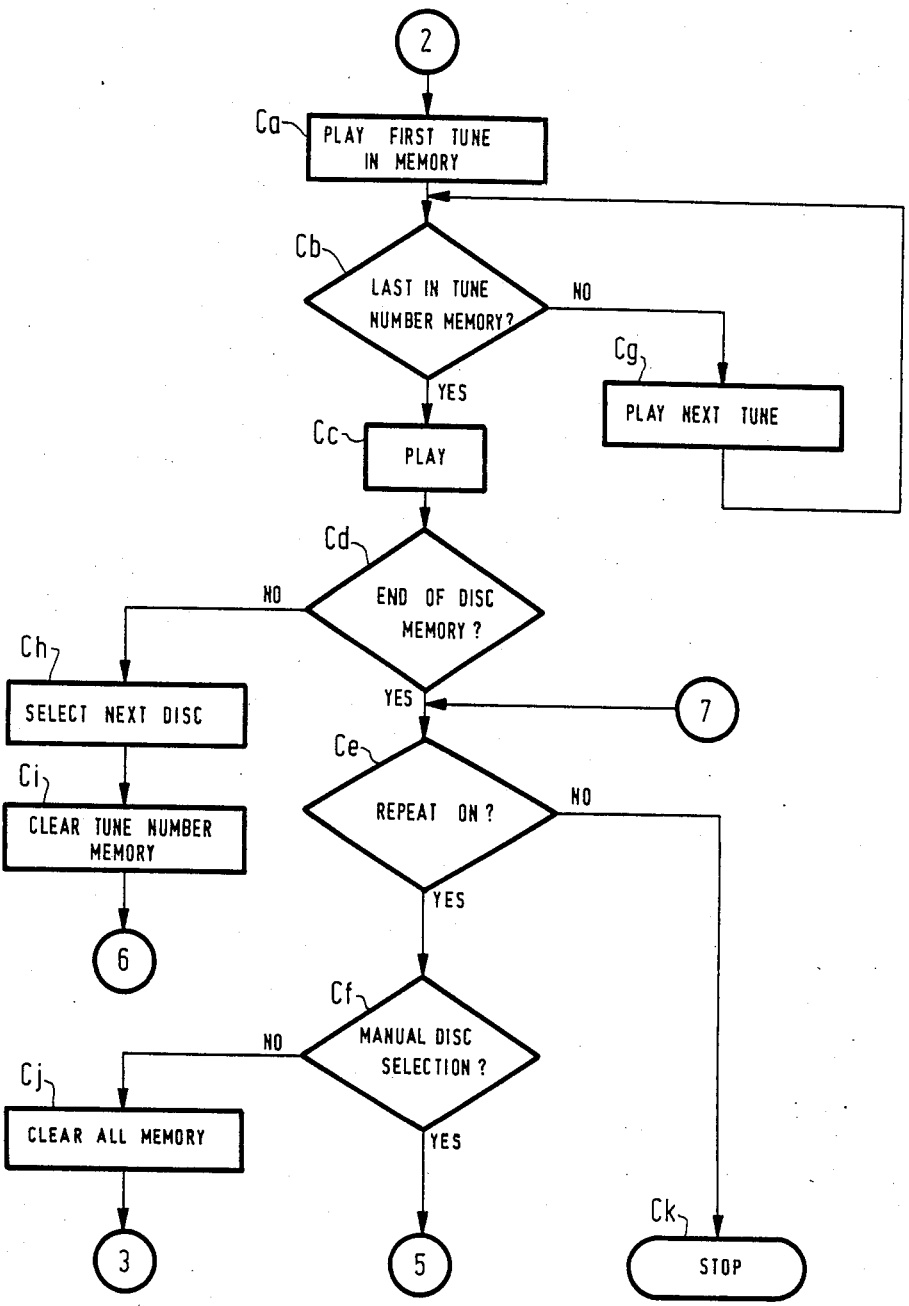
Figures 2D, 3:
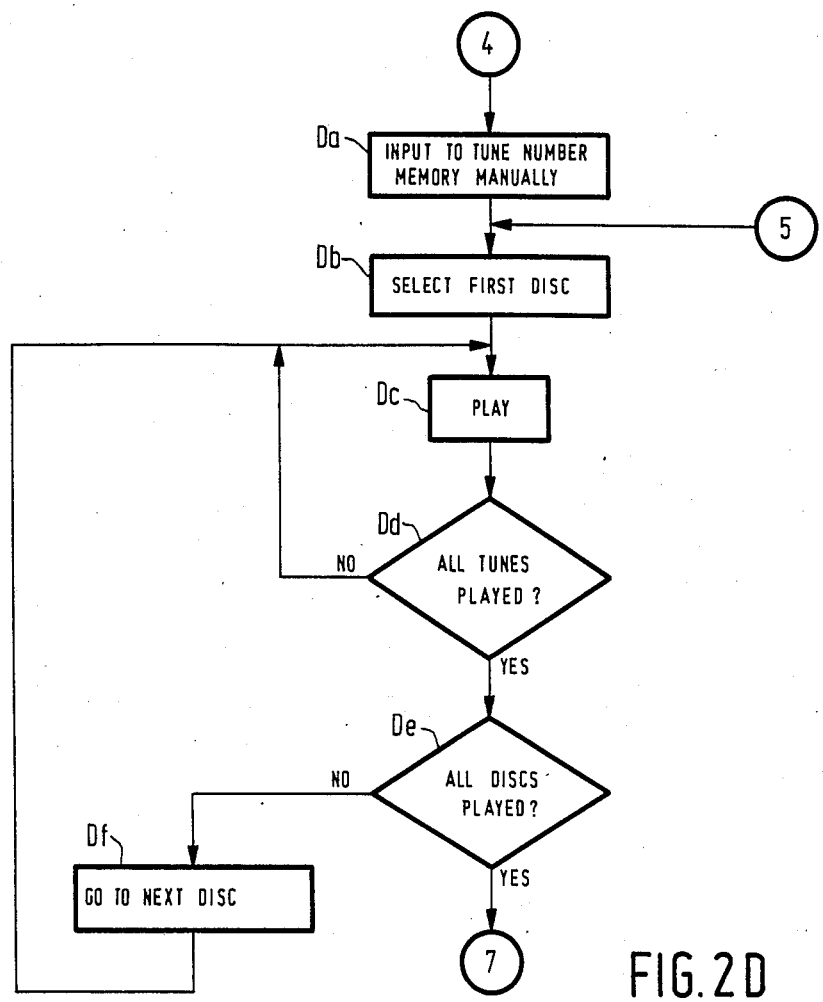

The control part 5 is furnished with a disc memory for the addresses 1–20 and a tune number memory with addresses 1–15, and, as shown in FIG. 3, and these memories store in numerical order (I), (I) or at random (II), (II) the digital codes for the disc numbers and the tune numbers which have been obtained from the setting part 8. Subsequently these are sent out in sequentially. Disc selection and tune number selection are controlled on this basis.

Moreover it may also be possible to set a single disc 9 on the player directly but this does not change the situation described above.

The operation of the system is described below with reference to FIGS. 2A–2D.

First of all if the keyboard 81 is operated with the switching mechanism 84 in the "a" position and the system is started at Aa, the whole of the memory in the control part 5 is cleared at Ab and the disc select mode is established. Then the selection of discs is set to automatic or otherwise at Ac with the keyboard 81, and if automatic selection is set at Ac then whether or not random number setting is to be executed is assessed at Ad. If the answer is YES then the switching mechanism 84 is set to the "b" or "c" position and the random numbers for the disc numbers 1–20 are generated by the random number generator for disc selection 82. The random number which is generated is supplied to the control part 5 where it is checked at Af in respect of whether or not it is the first time this number has been generatedd, and if it is the first time this number has been generated it is subsequently stored in the disc memory at Ag, after which a check is made as to whether or not the disc memory is full at Ah and if not the process is repeated until the memory is full [FIG. 3 (II)].

If manual operation is selected at Ac then the switching mechanism 84 remains set to "a" and a disc number is stored appropriately in the disc memory at Aj manually using the keyboard 81, after which an assessment is made as to whether or not the memory is full at Ak and if it is not then numbers are stored until the memory is full. If the answer to the question of random number setting is NO at Ad then if the disc numbers are set in numerical order from 1 to 20 the digital codes for 1 to 20 will be sent automatically to the disc memory of the control part 5 where they are stored at Ai [FIG. 3 (I)].

Then whether or not the tune numbers are to be set automatically is queried on the keyboard at Ba, and if the answer is YES then the disc at the first address in the disc memory is selected and set by the operation of the control part 5 and the disc selecting equipment 2 assuming the operational condition at Bb. The pick-up system operates the tune information and time information is read out from the disc at Bc and the number of tunes n is detected. Furthermore whether or not tune number selection is to be made at random is queried at Bd, and if the answer is YES then the switching mechanism 84 is set to "c" and a random number with a digital code corresponding to tune number 1 to n is generated at Be by the random number generator for tune number selection 83. This random number is supplied to the control part 5 and an assessment of whether or not this is the first time this number has been selected is made at Bf, and only if it is the first time the number has been selected is it stored in the tune number memory at Bg in the control part 5. An assessment of whether or not the tune number memory is full is made at Bh and numbers are stored in this way until the memory is full [FIG. 3 (II)].

If the answer is NO when deciding whether or not to use random numbers for tune number selection at Bd, then the tune numbers are set in numerical order and the digital codes for 1 - n are put out automatically in sequence and stored at Bi in the tune number memory of the control part 5 [FIG. 3 (I)].

If the response to the question of whether or not tune number selection is to be made using random numbers at Ba is NO, then the switching mechanism 84 is set to "a" or "b" and the digital codes for the tune numbers are stored in the tune numbers memory of the control part 5 at Da manually by means of the keyboard 81.

Then the tune with the first address in the tune number memory is played at Ca, the pick-up system 3 being shifted appropriately by the operation of the control part 5 and the servo system 6. Moreover during the play an assessment is made at Cb as to whether or not this is the last tune number in the tune number memory and if the answer is NO then the next tune is played at Cg until a YES response is finally achieved when the last tune is being played and an assessment is then made at Cd as to whether or not this is the last disc in the disc memory, and if the response is NO a switch is made to the next disc at Ch by means of the operation of the control part 5 and the disc selecting equipment 2 in accordance with the content of the remaining disc memory, the tune number memory is cleared at Ci and the system reverts to the read in at Bc of the tune information and timing information for the disc which has now been set on the player.

If the response to the query about the state of the disc memory is YES then the choice of whether or not to switch the repeat ON is made at Ce by means of the keyboard and if the response at this stage is NO then the whole operation is stopped at Ck.

Furthermore if the response as to whether or not the repeat is ON at Ce is YES then an assessment of whether or not the subsequent disc selection is to be made manually is made at Cf and if the response is NO then the whole of the memory is cleared and the system reverts to the condition in which the choice of disc selection to be made with random number setting at Ad is made.

If the answer at Cf to the question of whether or not the disc selection is to be made manually is YES then, as in the case of the manual input of the tune number selection, the first disc is selected at Dd and it is then selected and set on the player by the operation of the control part 5 and the disc selecting equipment 2. The pick-up system 3 is moved and the disc is played at Dc, an assessment is made as to whether or not all the tunes have been played at Dd. When all the tunes have been played an assessment is made at De as to whether all of the discs have been played and if the response is NO then the next disc is selected and set on the player in the same way as before and the play condition Dc is resumed.

If it is determined at De that all the discs have been played then the system reverts to the condition for the selection whether or not to switch the repeat ON once again.

1—Disc box
2—Disc selecting equipment
3—Pick-up system
4—Decoder
5—Control Part
6—Servo system
7—Output terminal
8—Setting part
81—Keyboard 82—Random number generator for disc selection
83—Random number generator for tune number selection
84—Switching mechanism

What is claimed is:

1. A compact disc player for playing a plurality of compact discs in a sequence comprising:
    a disc box for storing a plurality of compact discs;
    disc selection means for removing one of said discs and loading it into a playing position in response to a selection signal;
    a disc pick-up system for selecting one of a plurality of information pieces stored on said one compact disc and reading said selected piece;
    a first random selection means for generating a sequence of disc selection signals for said disc selection means; and;
    a second random selection means for generating a sequence of piece selection signals for said disc pick-up system, whereby said disc player plays in a random sequence each piece on a compact disc which compact disc is itself selected randomly from a plurality of compact discs.

2. The compact disc player of claim 1 wherein each of said random selection means includes a memory for storing a random sequence.

3. A compact disc player according to claim 2 further comprising:
    keyboard entry means; and
    means for programming each of said memories in a sequence entered by said keyboard means.

4. The compact disc player according to claim 2 wherein each of said random selection means generates random selection numbers, and stores only those random numbers not previously generated in a respective memory.

* * * * *